US012706138B2

(12) United States Patent
Lu

(10) Patent No.: US 12,706,138 B2
(45) Date of Patent: Aug. 11, 2026

(54) DATA READ CIRCUIT AND STORAGE DEVICE THEREOF

(71) Applicant: CXMT Corporation, Hefei City (CN)

(72) Inventor: Yaohua Lu, Hefei City (CN)

(73) Assignee: CXMT Corporation, Hefei City (CN)

( * ) Notice: Subject to any disclaimer, the term of this patent is extended or adjusted under 35 U.S.C. 154(b) by 122 days.

(21) Appl. No.: 18/923,627

(22) Filed: Oct. 22, 2024

(65) Prior Publication Data

US 2025/0046364 A1 Feb. 6, 2025

Related U.S. Application Data

(63) Continuation of application No. PCT/CN2023/094841, filed on May 17, 2023.

(30) Foreign Application Priority Data

Jan. 5, 2023 (CN) ......................... 202310015558.6

(51) Int. Cl.
*G11C 11/4093* (2006.01)
*G11C 11/4096* (2006.01)
*H03K 19/017* (2006.01)
*G11C 11/4074* (2006.01)

(52) U.S. Cl.
CPC ...... *G11C 11/4096* (2013.01); *G11C 11/4093* (2013.01); *H03K 19/01742* (2013.01); *G11C 11/4074* (2013.01)

(58) Field of Classification Search
CPC ............ G11C 11/4074; G11C 11/4093; G11C 11/4096; H03K 19/01742
USPC .................................................. 365/189.011
See application file for complete search history.

(56) References Cited

U.S. PATENT DOCUMENTS 6,317,369 B1 * 11/2001 Kubo ....................... G11C 7/22 365/189.05
9,797,949 B2 * 10/2017 Oshiyama ........ G01R 31/31727
2002/0067785 A1 * 6/2002 Tanahashi ............. H03L 7/0814 375/354
2006/0023555 A1 * 2/2006 Morishima ........... G11C 11/413 365/230.03
2009/0016126 A1 * 1/2009 Teramoto ......... G11C 29/50008 365/194

* cited by examiner

*Primary Examiner* — Ly D Pham
(74) *Attorney, Agent, or Firm* — Syncoda LLC; Feng Ma

(57) ABSTRACT

The present disclosure provides a data read circuit and a storage device thereof. The data read circuit includes: a first data transmission path for transmitting first data; a second data transmission path for transmitting second data; a control circuit for receiving a control signal, a first selection signal, and a second selection signal, and outputting a first output signal and a second output signal; and an output circuit for outputting the first data and the second data based on the first output signal and the second output signal, where the output circuit transmits the first data to a third data transmission path before the second data or transmits the second data to a third data transmission path before the first data.

20 Claims, 5 Drawing Sheets

B4

Rd_ini

Rd_bst

DoutSelE

DoutSelO

DATA READ CIRCUIT AND STORAGE DEVICE THEREOF

CROSS-REFERENCE TO RELATED APPLICATIONS

This is a continuation of International Patent Application No. PCT/CN2023/094841 filed on May 17, 2023, which claims priority to Chinese Patent Application No. 202310015558.6 filed on Jan. 5, 2023. The disclosures of the above-referenced applications are hereby incorporated by reference in their entirety.

BACKGROUND

As a high-speed and large-capacity data storage carrier, a dynamic random access memory (DRAM) is an indispensable part in most electronic systems. A smallest memory cell in the DRAM includes a capacitor and a transistor. An operation mechanism of the DRAM is divided into read and write. When a read operation is performed, a bit line (BL) is first charged to a half of an operating voltage (VDD/2), and then the transistor is turned on through a word line (WL), to generate a phenomenon of charge sharing between the capacitor and the bit line. If a stored value in the capacitor is 1, a voltage of the bit line is raised by charge sharing to be greater than the half of the operating voltage. If a stored value in the capacitor is 0, a voltage of the bit line is lowered to be less than the half of the operating voltage. After the voltage of the bit line is obtained, amplification needs to be performed through an amplifier, to determine the stored value in the capacitor. When a write operation is performed, the transistor is controlled, through the word line, to be turned on. If 1 needs to be written, the voltage of the bit line is raised to the operating voltage, so that the capacitor stores a corresponding charge. If 0 needs to be written, the voltage of the bit line is lowered to a low level, to discharge a charge in the capacitor.

However, in a data write process, data is always written into different memory arrays in a specific sequence. In a data read process, when data stored in the memory array is to be read in a different sequence, additional commands need to be conveyed to the memory, resulting in an increase in power consumption of the memory.

SUMMARY

Embodiments of the present disclosure relate to the field of semiconductor technologies, and in particular, to a data read circuit and a storage device thereof.

Embodiments of the present disclosure provide a data read circuit and a storage device thereof, to at least help reduce power consumption for data transmission.

According to some embodiments of the present disclosure, an aspect of the embodiments of the present disclosure provides a data read circuit, including: a first data transmission path, configured to transmit first data; a second data transmission path, configured to transmit second data; a control circuit, the control circuit having a first output terminal and a second output terminal, the control circuit being configured to: receive a control signal, a first selection signal, and a second selection signal, and output a first output signal and a second output signal, and in the same cycle, a waveform of the first output signal being the same as a waveform of one of the first selection signal and the second selection signal, and a waveform of the second output signal being the same as a waveform of the other one of the first selection signal and the second selection signal; and an output circuit, configured to output the first data and the second data based on the first output signal and the second output signal, the first data being transmitted to a third data transmission path before the second data if the waveform of the first output signal is the same as a waveform of the first selection signal, and the waveform of the second output signal is the same as a waveform of the second selection signal; or the second data being transmitted to the third data transmission path before the first data if the waveform of the first output signal is the same as a waveform of the second selection signal, and the waveform of the second output signal is the same as a waveform of the first selection signal.

In some embodiments, the output circuit includes: a first output circuit, connected to the first output terminal, receiving the first data, and configured to transmit the first data to the third data transmission path based on the first output signal; and a second output circuit, connected to the second output terminal, receiving the second data, and configured to transmit the second data to the third data transmission path based on the second output signal.

In some embodiments, the control circuit is configured to: output the first selection signal as the first output signal and output the second selection signal as the second output signal based on the control signal when the control signal is in a first state, or output the second selection signal as the first output signal and output the first selection signal as the second output signal based on the control signal when the control signal is in a second state.

In some embodiments, the control circuit includes: a first data selector, a first input terminal of the first data selector receiving the first selection signal, a second input terminal of the first data selector receiving the second selection signal, a data selection terminal of the first data selector receiving the control signal, and an output terminal of the first data selector serving as the first output terminal; and a second data selector, a first input terminal of the second data selector receiving the first selection signal, a second input terminal of the second data selector receiving the second selection signal, a data selection terminal of the second data selector receiving an inverted signal of the control signal, and an output terminal of the second data selector serving as the second output terminal.

In some embodiments, the waveform of the first output signal is the same as the waveform of the first selection signal, and the waveform of the second output signal is the same as the waveform of the second selection signal when the control signal is in the first state, or the waveform of the first output signal is the same as the waveform of the second selection signal, and the waveform of the second output signal is the same as the waveform of the first selection signal when the control signal is in the second state.

In some embodiments, the control circuit includes: a first control circuit having the first output terminal, the first control circuit receiving the first selection signal, the second selection signal, the control signal, and the inverted signal of the control signal, and being configured to output the first output signal based on the control signal and the inverted signal of the control signal; and a second control circuit having the second output terminal, the second control circuit receiving the first selection signal, the second selection signal, the control signal, and the inverted signal of the control signal, and being configured to output the second output signal based on the control signal and the inverted signal of the control signal.

In some embodiments, the control circuit further includes a first inverter and a second inverter, an input terminal of the first inverter receives the control signal, an output terminal of the first inverter outputs the inverted signal of the control signal, one input terminal of each of the first control circuit and the second control circuit is electrically connected to the output terminal of the first inverter, to receive the inverted signal of the control signal, an input terminal of the second inverter is electrically connected to the output terminal of the first inverter, an output terminal of the second inverter outputs the control signal, and the other input terminal of each of the first control circuit and the second control circuit is electrically connected to the output terminal of the second inverter, to receive the control signal.

In some embodiments, the first control circuit includes: a first AND gate unit, one input terminal receiving the first selection signal, the other input terminal receiving the control signal, and an output terminal outputting a first signal; a second AND gate unit, one input terminal receiving the second selection signal, the other input terminal receiving the inverted signal of the control signal, and an output terminal outputting a second signal; and a first NOR gate unit, one input terminal receiving the first signal, the other input terminal receiving the second signal, and an output terminal outputting the first output signal.

In some embodiments, the second control circuit includes: a third AND gate unit, one input terminal receiving the first selection signal, the other input terminal receiving the inverted signal of the control signal, and an output terminal outputting a third signal; a fourth AND gate unit, one input terminal receiving the second selection signal, the other input terminal receiving the control signal, and an output terminal outputting a fourth signal; and a second NOR gate unit, one input terminal receiving the third signal, the other input terminal receiving the fourth signal, and an output terminal outputting the second output signal.

In some embodiments, the first control circuit includes: a first pull-up unit, connected between a power supply node and a first node, and configured to pull up a voltage at the first node based on the first selection signal, the second selection signal, the control signal, and the inverted signal of the control signal; and a first pull-down unit, connected between a ground terminal and the first node, and configured to pull down the voltage at the first node based on the first selection signal, the second selection signal, the control signal, and the inverted signal of the control signal, where the first node outputs the first output signal.

In some embodiments, the first pull-up unit includes: at least two PMOS transistors connected in parallel between the first node and a second node, gates of the at least two PMOS transistors respectively receiving the first selection signal or the control signal; and at least two PMOS transistors connected in parallel between the power supply node and the second node, gates of the at least two PMOS transistors respectively receiving the second selection signal or the inverted signal of the control signal.

In some embodiments, the first pull-up unit includes: a first PMOS transistor, connected between the first node and the second node, a gate of the first PMOS transistor receiving the first selection signal; a second PMOS transistor, connected between the first node and the second node, a gate of the second PMOS transistor receiving the control signal; a third PMOS transistor, connected between the power supply node and the second node, a gate of the third PMOS transistor receiving the second selection signal; and a fourth PMOS transistor, connected between the power supply node and the second node, a gate of the fourth PMOS transistor receiving the inverted signal of the control signal.

In some embodiments, the first pull-down unit includes: at least two NMOS transistors connected in series between the first node and the ground terminal, gates of the at least two NMOS transistors respectively receiving the second selection signal or the inverted signal of the control signal; and at least two NMOS transistors connected in series between the first node and the ground terminal, gates of the at least two NMOS transistors respectively receiving the first selection signal or the control signal.

In some embodiments, the first pull-down unit includes: a first NMOS transistor and a second NMOS transistor, a drain of the first NMOS transistor being connected to the first node, a source of the first NMOS transistor being connected to a drain of the second NMOS transistor, a source of the second NMOS transistor being connected to the ground terminal, a gate of the first NMOS transistor receiving the second selection signal, and a gate of the second NMOS transistor receiving the inverted signal of the control signal; and a third NMOS transistor and a fourth NMOS transistor, a drain of the third NMOS transistor being connected to the first node, a source of the third NMOS transistor being connected to a drain of the fourth NMOS transistor, a source of the fourth NMOS transistor being connected to the ground terminal, a gate of the third NMOS transistor receiving the first selection signal, and a gate of the fourth NMOS transistor receiving the control signal.

In some embodiments, the second control circuit includes: a second pull-up unit, connected between a power supply node and a third node, and configured to pull up a voltage at the third node based on the first selection signal, the second selection signal, the control signal, and the inverted signal of the control signal; and a second pull-down unit, connected between a ground terminal and the third node, and configured to pull down the voltage at the third node based on the first selection signal, the second selection signal, the control signal, and the inverted signal of the control signal, where the third node outputs the second output signal.

In some embodiments, the second pull-up unit includes: at least two PMOS transistors connected in parallel between the third node and a fourth node, gates of the at least two PMOS transistors respectively receiving the first selection signal or the inverted signal of the control signal; and at least two PMOS transistors connected in parallel between the power supply node and the fourth node, gates of the at least two PMOS transistors respectively receiving the second selection signal or the control signal.

In some embodiments, the second pull-up unit includes: a fifth PMOS transistor, connected between the third node and the fourth node, a gate of the fifth PMOS transistor receiving the first selection signal; a sixth PMOS transistor, connected between the third node and the fourth node, a gate of the sixth PMOS transistor receiving the inverted signal of the control signal; a seventh PMOS transistor, connected between the power supply node and the fourth node, a gate of the seventh PMOS transistor receiving the second selection signal; and an eighth PMOS transistor, connected between the power supply node and the fourth node, a gate of the eighth PMOS transistor receiving the control signal.

In some embodiments, the second pull-down unit includes: at least two NMOS transistors connected in series between the third node and the ground terminal, gates of the at least two NMOS transistors respectively receiving the second selection signal or the control signal; and at least two NMOS transistors connected in series between the third node and the ground terminal, gates of the at least two NMOS transistors respectively receiving the first selection signal or the inverted signal of the control signal.

In some embodiments, the second pull-down unit includes: a fifth NMOS transistor and a sixth NMOS transistor, a drain of the fifth NMOS transistor being connected to the third node, a source of the fifth NMOS transistor being connected to a drain of the sixth NMOS transistor, a source of the sixth NMOS transistor being connected to the ground terminal, a gate of the fifth NMOS transistor receiving the second selection signal, and a gate of the sixth NMOS transistor receiving the control signal; and a seventh NMOS transistor and an eighth NMOS transistor, a drain of the seventh NMOS transistor being connected to the third node, a source of the seventh NMOS transistor being connected to a drain of the eighth NMOS transistor, a source of the eighth NMOS transistor being connected to the ground terminal, a gate of the seventh NMOS transistor receiving the first selection signal, and a gate of the eighth NMOS transistor receiving the inverted signal of the control signal.

According to some embodiments of the present disclosure, another aspect of the embodiments of the present disclosure further provides a storage device, including the data read circuit according to any one of the foregoing embodiments.

BRIEF DESCRIPTION OF DRAWINGS

One or more embodiments are exemplified with the figures in the accompanying drawings corresponding to the one or more embodiments. These example descriptions are not intended to limit the embodiments, and unless specifically stated, no scale limitations are constituted by the figures in the accompanying drawings. To describe the technical solutions in the embodiments of the present disclosure or the conventional technologies more clearly, the accompanying drawings required by the embodiments are briefly described below. Clearly, the accompanying drawings in the following description show merely some embodiments of the present disclosure, and other drawings may be obtained by a person of ordinary skill in the art from these accompanying drawings without creative efforts.

DETAILED DESCRIPTION

Figures 1, 2:
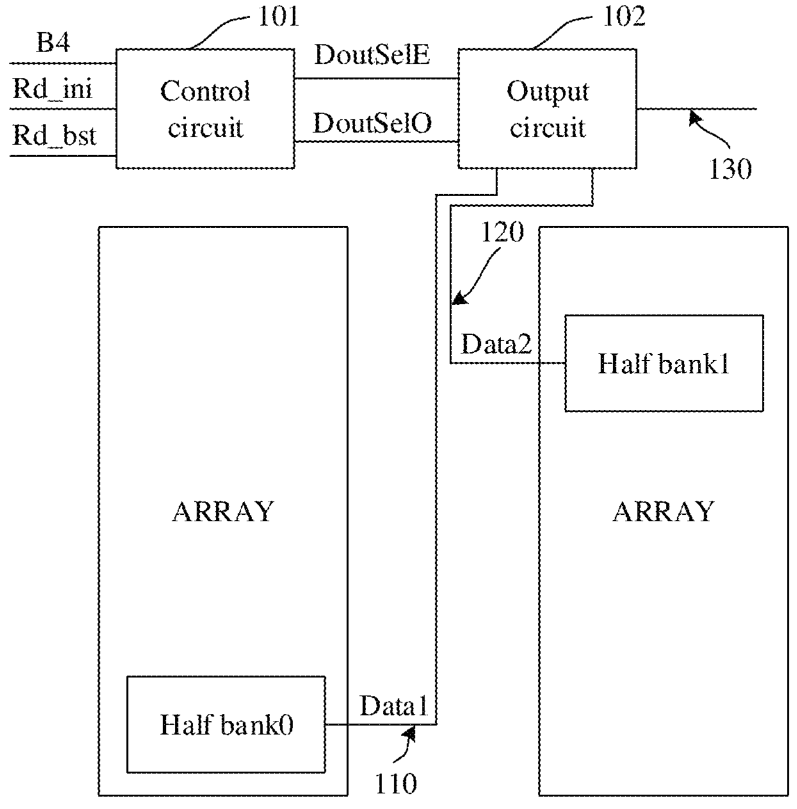
FIG. 1 is a functional block diagram of a data read circuit according to an embodiment of the present disclosure.
FIG. 2 is a partial waveform diagram of a control signal, a first selection signal, a second selection signal, a first output signal, and a second output signal in a data read circuit according to an embodiment of the present disclosure.

It may be learned from the background that power consumption of a memory needs to be reduced.

It is found, through analysis, that in some memories such as a low power double data rate 5 (LPDDR5) memory, a burst length is 32 bits. During data writing into the memory, data is always written in a sequence of 0 to 31. Data in a sequence of 0 to 15 is written into a storage sub-part, data in a sequence of 16 to 31 is written into another storage sub-part, and different storage sub-parts are located in different areas in a memory array. During data reading from the memory, if a read command provided to the memory array is in a first state, the 32-bit data stored in the memory array is read in the sequence of 0 to 31; or if a read command provided to the memory array is in a second state, the data in the sequence of 16 to 31 is first read, and then the data in the sequence of 0 to 15 is read. The first state and the second state are different level value states of the read command. In addition, there is a fixed read sequence between different data ports.

Therefore, in different states of the read command, different data is transmitted from the memory array to the same data port. For example, when the read command is in the first state, the data in the sequence of 0 to 15 is transmitted to a first data port, and the data in the sequence of 16 to 31 is transmitted to a second data port; and when the read command is in the second state, the data in the sequence of 0 to 15 is transmitted to the second data port, and the data in the sequence of 16 to 31 is transmitted to the first data port. In this way, it is implemented that when the read command is in the first state, the 32-bit data stored in the memory array is read in the sequence of 0 to 31, and when the read command provided to the memory array is in the second state, the data in the sequence of 16 to 31 is first read, and then the data in the sequence of 0 to 15 is read.

However, in the foregoing data read manner, data transmission paths need to be provided between memory arrays in different areas and different data ports. For example, at least two data transmission paths are required for the data in the sequence of 0 to 15, to separately send the data in the sequence of 0 to 15 to the first data port and the second data port. In addition, the read command needs to be transmitted to the entire data transmission path, so that the memory determines, based on the read command, a specific data transmission path to be utilized to transmit data to a specific data port. In this way, there is a complex data transmission path in the memory and a long transmission path for the read command, resulting in relatively high power consumption of the memory.

The embodiments of the present disclosure provide a data read circuit and a storage device thereof. In the data read circuit, both a path configured to transmit first data and a path configured to transmit second data are fixed. This helps reduce complexity of transmission paths configured to transmit the first data and the second data. In addition, a control signal for controlling a transmission sequence of the first data and the second data does not need to be transmitted to a memory array through a transmission path, and only needs to be transmitted to a control circuit. This helps shorten a transmission path of the control signal in the data read circuit, to reduce power consumption required for transmitting the control signal. Furthermore, the control circuit outputs a first output signal and a second output signal based on the control signal, a first selection signal, and a second selection signal, and an output circuit adjusts the transmission sequence of the first data and the second data based on a waveform change of the first output signal and a waveform change of the second output signal. This helps reduce the power consumption required for transmitting the control signal, and ensure that the transmission sequence of the first data and the second data changes based on a change of the control signal.

The embodiments of the present disclosure are described in detail below with reference to the accompanying drawings. However, it may be understood by a person of ordinary skill in the art that in the embodiments of the present disclosure, many technical details are provided to enable readers to better understand the embodiments of the present disclosure. However, the technical solutions claimed in the embodiments of the present disclosure may be implemented even without these technical details and various changes and modifications made based on the following embodiments.

Figure 3:
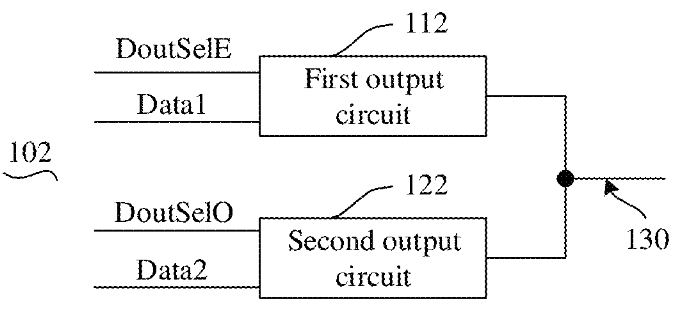
FIG. 3 is a functional block diagram of an output circuit in a data read circuit according to an embodiment of the present disclosure.
Figure 8:
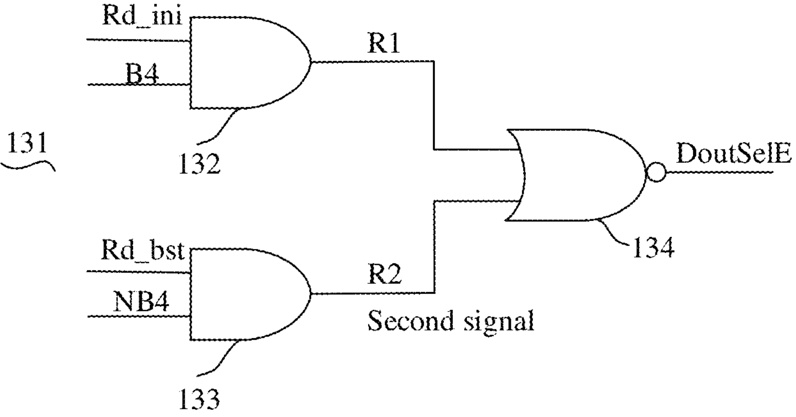
FIG. 8 is a logic circuit diagram of a first control circuit in a control circuit according to an embodiment of the present disclosure.
Figure 9:
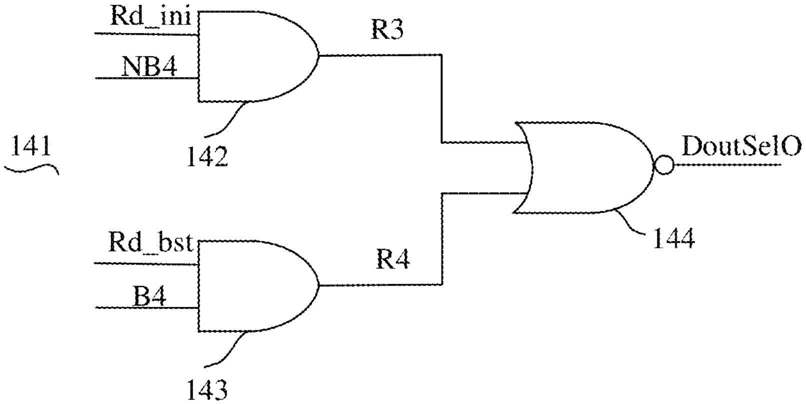
FIG. 9 is a logic circuit diagram of a second control circuit in a control circuit according to an embodiment of the present disclosure.
Figure 10:
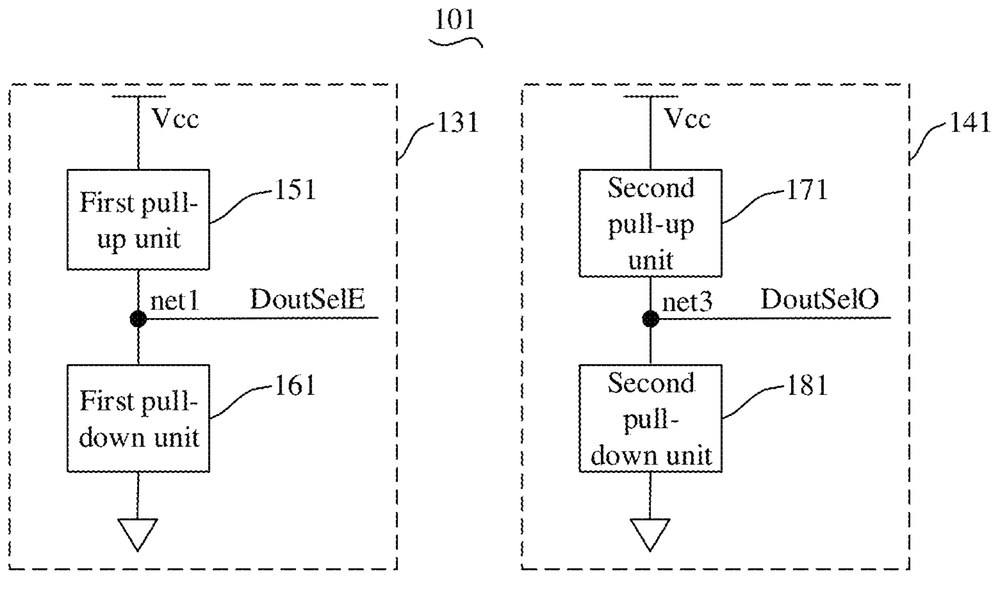
FIG. 10 is a circuit block diagram of a control circuit according to an embodiment of the present disclosure.
Figure 11:
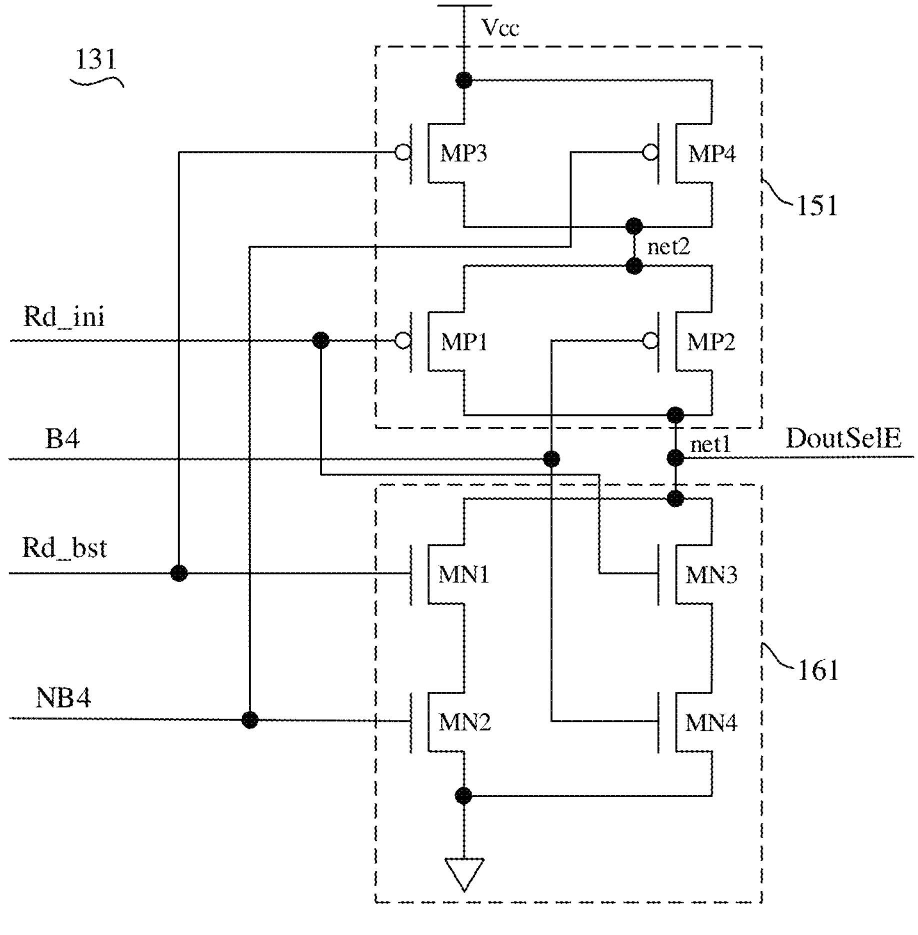
FIG. 11 is a circuit diagram of a first control circuit in a control circuit according to an embodiment of the present disclosure.
Figure 12:
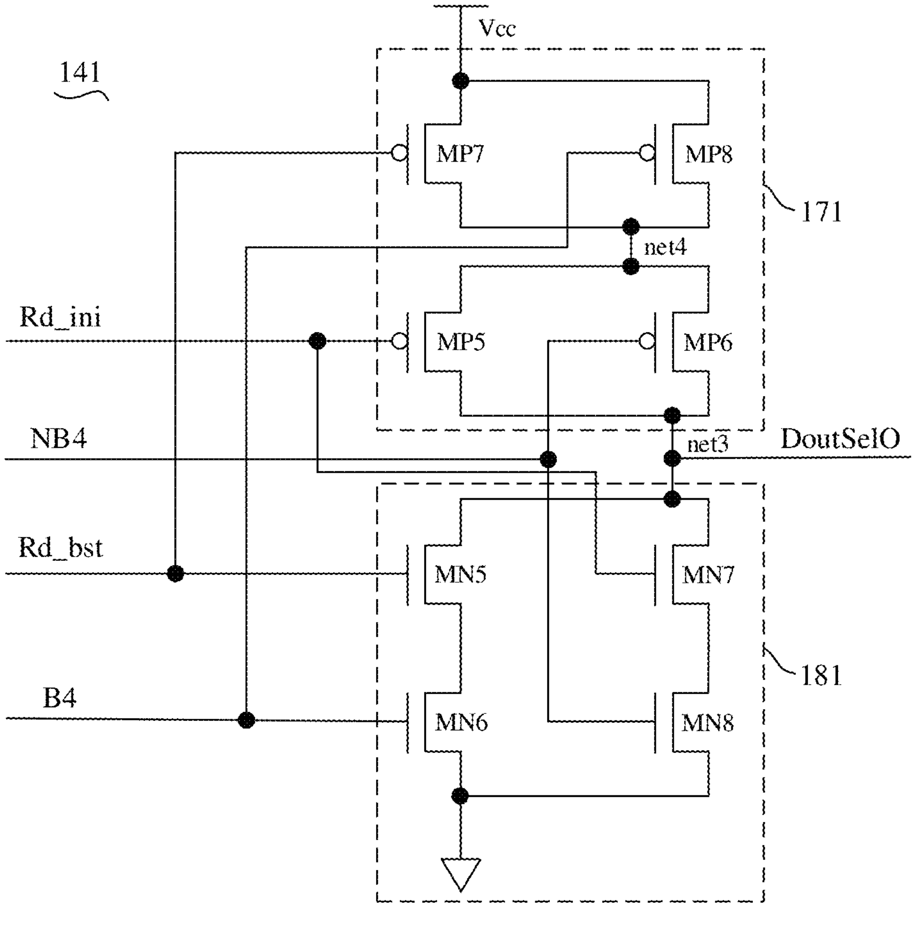
FIG. 12 is a circuit diagram of a second control circuit in a control circuit according to an embodiment of the present disclosure.

An embodiment of the present disclosure provides a data read circuit. The data read circuit provided in an embodiment of the present disclosure is described in detail below with reference to the accompanying drawings. FIG. 1 is a functional block diagram of a data read circuit according to an embodiment of the present disclosure. FIG. 2 is a partial waveform diagram of a control signal, a first selection signal, a second selection signal, a first output signal, and a second output signal in a data read circuit according to an embodiment of the present disclosure. FIG. 3 is a functional block diagram of an output circuit in a data read circuit according to an embodiment of the present disclosure. FIG. 4 to FIG. 7 are four schematic structural diagrams of a control circuit in a data read circuit according to an embodiment of the present disclosure. FIG. 8 is a logic circuit diagram of a first control circuit in a control circuit according to an embodiment of the present disclosure. FIG. 9 is a logic circuit diagram of a second control circuit in a control circuit according to an embodiment of the present disclosure. FIG. 10 is a circuit block diagram of a control circuit according to an embodiment of the present disclosure. FIG. 11 is a circuit diagram of a first control circuit in a control circuit according to an embodiment of the present disclosure. FIG. 12 is a circuit diagram of a second control circuit in a control circuit according to an embodiment of the present disclosure.

Referring to FIG. 1 and FIG. 2, the data read circuit includes: a first data transmission path 110, configured to transmit first data Data1; a second data transmission path 120, configured to transmit second data Data2; a control circuit 101, the control circuit 101 having a first output terminal and a second output terminal, the control circuit 101 being configured to: receive a control signal B4, a first selection signal Rd_ini, and a second selection signal Rd_bst, and output a first output signal DoutSelE and a second output signal DoutSelO, and in the same cycle, a waveform of the first output signal DoutSelE being the same as a waveform of one of the first selection signal Rd_ini and the second selection signal Rd_bst, and a waveform of the second output signal DoutSelO being the same as a waveform of the other one of the first selection signal Rd_ini and the second selection signal Rd_bst; and an output circuit 102, configured to output the first data Data1 and the second data Data2 based on the first output signal DoutSelE and the second output signal DoutSelO, the first data Data1 being transmitted to a third data transmission path 130 before the second data Data2 if the waveform of the first output signal DoutSelE is the same as a waveform of the first selection signal Rd_ini, and the waveform of the second output signal DoutSelO is the same as a waveform of the second selection signal Rd_bst; or the second data Data2 being transmitted to a third data transmission path 130 before the first data Data1 if the waveform of the first output signal DoutSelE is the same as a waveform of the second selection signal Rd_bst, and the waveform of the second output signal DoutSelO is the same as a waveform of the first selection signal Rd_ini.

It may be understood that the first output signal DoutSelE and the second output signal DoutSelO are configured to control a sequence of transmitting the first data Data1 and the second data Data2 received by the output circuit 102 to the third data transmission path 130. In addition, the control circuit 101 adjusts a waveform relationship between each of the first output signal DoutSelE and the second output signal DoutSelO that are output and each of the first selection signal Rd_ini and the second selection signal Rd_bst based on the control signal B4, to implement that the first output signal DoutSelE and the second output signal DoutSelO change differently based on a difference in the control signal B4, so as to implement that the first output signal DoutSelE and the second output signal DoutSelO change differently when the control signal B4 is in different states. In this way, the first data Data1 and the second data Data2 are transmitted to the third data transmission path 130 in a different sequence, to change a different read sequence of the same data in a memory array ARRAY.

In addition, a path configured to transmit the first data Data1 is fixed, that is, the first data transmission path 110, and a path configured to transmit the second data Data2 is also fixed, that is, the second data transmission path 120. This helps simplify transmission paths configured to transmit the first data Data1 and the second data Data2. In addition, the control signal B4 for controlling a transmission sequence of the first data Data1 and the second data Data2 does not need to be transmitted to the memory array ARRAY through a transmission path, and only needs to be transmitted to the control circuit 101. This helps shorten a transmission path of the control signal B4 in the data read circuit, to reduce power consumption required for transmitting the control signal B4.

In some embodiments, referring to FIG. 1, the first data Data1 and the second data Data2 are respectively from different areas in the memory array ARRAY. For example, the first data Data1 is from a first storage part Half bank0 in the memory array ARRAY, and the second data Data2 is from a second storage part Half bank1 in the memory array ARRAY.

In some embodiments, the first data transmission path 110 may be 16 global input/output lines, to transmit 16-bit parallel first data Data1; and the second data transmission path 120 may also be 16 global input/output lines, to transmit 16-bit parallel second data Data2.

An embodiment of the present disclosure is described in more detail below with reference to the accompanying drawings.

In some embodiments, with reference to FIG. 1 and FIG. 3, the output circuit 102 includes: a first output circuit 112, connected to the first output terminal, receiving the first data Data1, and configured to transmit the first data Data1 to the third data transmission path 130 based on the first output signal DoutSelE; and a second output circuit 122, connected to the second output terminal, receiving the second data Data2, and configured to transmit the second data Data2 to the third data transmission path 130 based on the second output signal DoutSelO.

It should be noted that if the first output terminal of the control circuit 101 may be configured to output the first output signal DoutSelE, and the second output terminal of the control circuit may be configured to output the second output signal DoutSelO, the first output circuit 112 connected to the first output terminal receives the first output signal DoutSelE, and the second output circuit 122 connected to the second output terminal receives the second output signal DoutSelO.

In some embodiments, that the first output circuit 112 is configured to transmit the first data Data1 to the third data transmission path 130 based on the first output signal DoutSelE means that the first output circuit 112 transmits the received first data Data1 to the third data transmission path 130 based on a valid state of the first output signal DoutSelE. The valid state of the first output signal DoutSelE refers to a phase in which the first output signal DoutSelE is at a high level.

That the second output circuit 122 is configured to transmit the second data Data2 to the third data transmission path 130 based on the second output signal DoutSelO means that the second output circuit 122 transmits the received second data Data2 to the third data transmission path 130 based on a valid state of the second output signal DoutSelO. The valid state of the second output signal DoutSelO refers to a phase in which the second output signal DoutSelO is at a high level.

In this way, because the waveform of the first output signal DoutSelE is different from the waveform of the second output signal DoutSelO in the same cycle, that is, at the same moment, only one of the first output signal DoutSelE and the second output signal DoutSelO is in the valid state, only one of the first output circuit 112 and the second output circuit 122 transmits the received data to the third data transmission path 130. Therefore, the output circuit 102 can adjust, based on waveform changes of the first output signal DoutSelE and the second output signal DoutSelO, the sequence of transmitting the first data Data1 and the second data Data2 to the third data transmission path 130.

In some embodiments, referring to FIG. 2, in the foregoing embodiment, the waveform of the first output signal DoutSelE is the same as the waveform of the first selection signal Rd_ini, and the waveform of the second output signal DoutSelO is the same as the waveform of the second selection signal Rd_bst when the control signal B4 is in a first state, for example, when the control signal B4 is at a low level, or the waveform of the first output signal DoutSelE is the same as the waveform of the second selection signal Rd_bst, and the waveform of the second output signal DoutSelO is the same as the waveform of the first selection signal Rd_ini when the control signal B4 is in a second state, for example, when the control signal B4 is at a high level.

In some embodiments, still referring to FIG. 2, in the same cycle, a phase in which the first selection signal Rd_ini is in a valid state occurs before a phase in which the second selection signal Rd_bst is in a valid state. The phase in which the first selection signal Rd_ini is in the valid state is a phase in which the first selection signal Rd_ini is at a high level, and the phase in which the second selection signal Rd_bst is in the valid state is a phase in which the second selection signal Rd_bst is at a high level.

It may be understood that when the control signal B4 is in the first state, for example, when the control signal B4 is at a low level, the phase in which the first output signal DoutSelE is in the valid state occurs before the phase in which the second output signal DoutSelO is in the valid state. In this case, the output circuit 102 first transmits the first data Data1 to the third data transmission path 130 based on the valid state of the first output signal DoutSelE, and then transmits the second data Data2 to the third data transmission path 130 based on the valid state of the second output signal DoutSelO, to first read the first data Data1 and then read the second data Data2.

When the control signal B4 is in the second state, for example, when the control signal B4 is at a high level, the phase in which the second output signal DoutSelO is in the valid state occurs before the phase in which the first output signal DoutSelE is in the valid state. In this case, the output circuit 102 first transmits the second data Data2 to the third data transmission path 130 based on the valid state of the second output signal DoutSelO, and then transmits the first data Data1 to the third data transmission path 130 based on the valid state of the first output signal DoutSelE, to first read the second data Data2 and then read the first data Data1.

How the control circuit 101 outputs the first output signal DoutSelE and the second output signal DoutSelO based on the control signal B4, the first selection signal Rd_ini, and the second selection signal Rd_bst is described in detail below.

Figure 4:
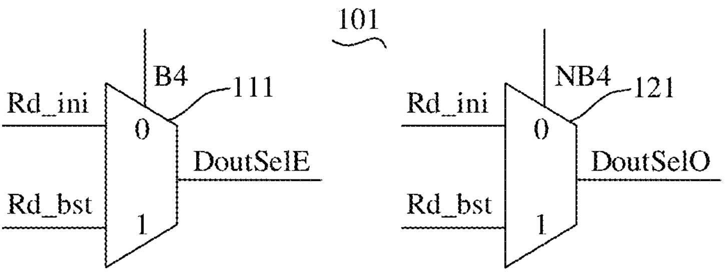
FIG. 4 is a first schematic structural diagram of a control circuit in a data read circuit according to an embodiment of the present disclosure.
Figure 5:
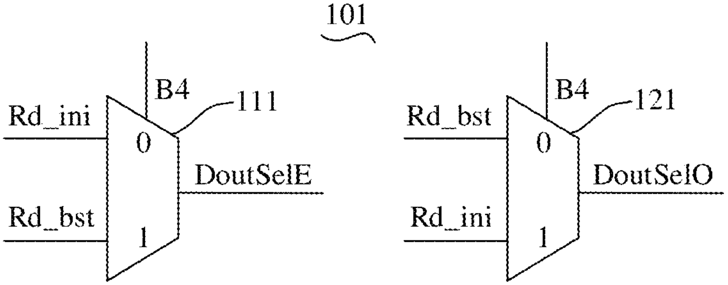
FIG. 5 is a second schematic structural diagram of a control circuit in a data read circuit according to an embodiment of the present disclosure.

In some embodiments, referring to FIG. 4 and FIG. 5, the control circuit 101 is configured to: output the first selection signal Rd_ini as the first output signal DoutSelE and output the second selection signal Rd_bst as the second output signal DoutSelO based on the control signal B4 when the control signal B4 is in the first state, or output the second selection signal Rd_bst as the first output signal DoutSelE and output the first selection signal Rd_ini as the second output signal DoutSelO based on the control signal B4 when the control signal B4 is in the second state.

In some embodiments, that the control signal B4 is in the first state means that the control signal B4 is at a low level, and that the control signal B4 is in the second state means that the control signal B4 is at a high level. In some other embodiments, that the control signal B4 is in the first state means that the control signal B4 is at a high level, and that the control signal B4 is in the second state means that the control signal B4 is at a low level. It should be noted that for ease of subsequent description, an example in which the first state of the control signal B4 is a low level and the second state of the control signal B4 is a high level is utilized for description.

The control circuit 101 utilizes one of the first selection signal Rd_ini and the second selection signal Rd_bst as the first output signal DoutSelE and the other one as the second output signal DoutSelO based on the control signal B4. This includes at least the following two embodiments.

In some embodiments, referring to FIG. 4, the control circuit 101 includes: a first data selector 111, a first input terminal of the first data selector 111 receiving the first selection signal Rd_ini, a second input terminal of the first data selector 111 receiving the second selection signal Rd_bst, a data selection terminal of the first data selector 111 receiving the control signal B4, and an output terminal of the first data selector 111 serving as the first output terminal; and a second data selector 121, a first input terminal of the second data selector 121 receiving the first selection signal Rd_ini, a second input terminal of the second data selector 121 receiving the second selection signal Rd_bst, a data selection terminal of the second data selector 121 receiving an inverted signal NB4 of the control signal B4, and an output terminal of the second data selector 121 serving as the second output terminal. It may be understood that the data selection terminal of the first data selector 111 and the data selection terminal of the second data selector 121 receive different data.

In some examples, if the control signal B4 is at a low level and the inverted signal NB4 of the control signal B4 is at a high level, the first data selector 111 outputs the first selection signal Rd_ini as the first output signal DoutSelE based on the control signal B4, and the second data selector 121 outputs the second selection signal Rd_bst as the second output signal DoutSelO based on the inverted signal NB4 of the control signal B4; or if the control signal B4 is at a high level and the inverted signal NB4 of the control signal B4 is at a low level, the first data selector 111 outputs the second selection signal Rd_bst as the first output signal DoutSelE based on the control signal B4, and the second data selector 121 outputs the first selection signal Rd_ini as the second output signal DoutSelO based on the inverted signal NB4 of the control signal B4.

In some other embodiments, referring to FIG. 5, the control circuit 101 includes: a first data selector 111, a first input terminal of the first data selector 111 receiving the first selection signal Rd_ini, a second input terminal of the first data selector 111 receiving the second selection signal Rd_bst, a data selection terminal of the first data selector 111 receiving the control signal B4, and an output terminal of the first data selector 111 serving as the first output terminal; and a second data selector 121, a first input terminal of the second data selector 121 receiving the second selection signal Rd_bst, a second input terminal of the second data selector 121 receiving the first selection signal Rd_ini, a data selection terminal of the second data selector 121 receiving the control signal B4, and an output terminal of the second data selector 121 serving as the second output terminal. It may be understood that the first input terminal of the first data selector 111 and the first input terminal of the second data selector 121 receive different data, and the second input terminal of the first data selector 111 and the second input terminal of the second data selector 121 receive different data.

In some examples, if the control signal B4 is at a low level and an inverted signal NB4 of the control signal B4 is at a high level, the first data selector 111 outputs the first selection signal Rd_ini as the first output signal DoutSelE based on the control signal B4, and the second data selector 121 outputs the second selection signal Rd_bst as the second output signal DoutSelO based on the control signal B4; or if the control signal B4 is at a high level and an inverted signal NB4 of the control signal B4 is at a low level, the first data selector 111 outputs the second selection signal Rd_bst as the first output signal DoutSelE based on the control signal B4, and the second data selector 121 outputs the first selection signal Rd_ini as the second output signal DoutSelO based on the control signal B4.

Figure 6:
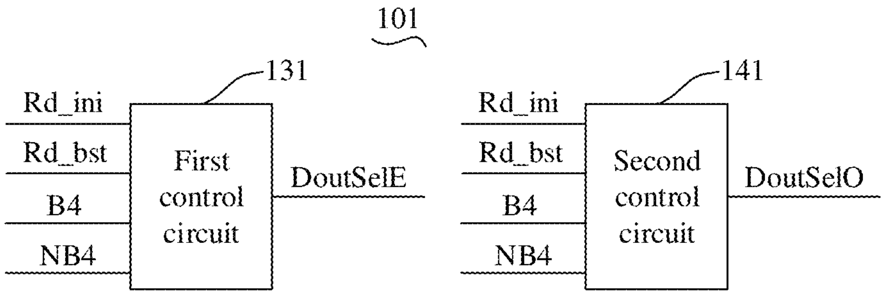
FIG. 6 is a third schematic structural diagram of a control circuit in a data read circuit according to an embodiment of the present disclosure.
Figure 7:
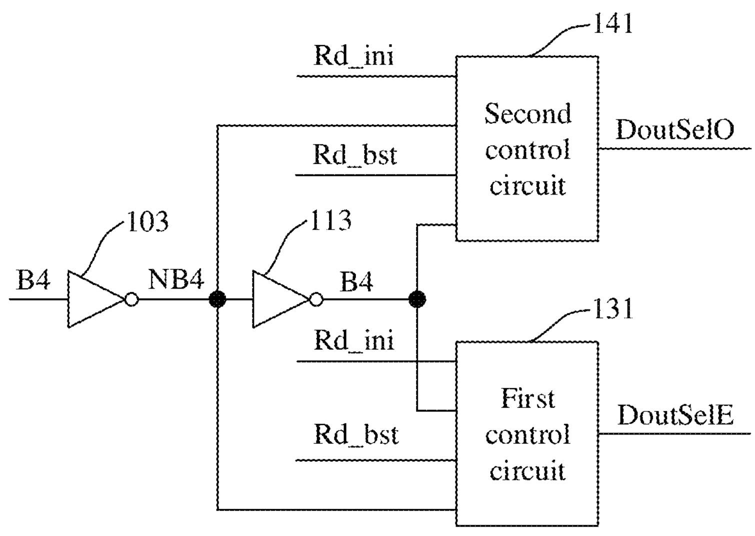
FIG. 7 is a fourth schematic structural diagram of a control circuit in a data read circuit according to an embodiment of the present disclosure.

In some other embodiments, referring to FIG. 6 and FIG. 7, the control circuit 101 may include: a first control circuit 131 having the first output terminal, the first control circuit 131 receiving the first selection signal Rd_ini, the second selection signal Rd_bst, the control signal B4, and the inverted signal NB4 of the control signal B4, and being configured to output the first output signal DoutSelE based on the control signal B4 and the inverted signal NB4 of the control signal B4; and a second control circuit 141 having the second output terminal, the second control circuit 141 receiving the first selection signal Rd_ini, the second selection signal Rd_bst, the control signal B4, and the inverted signal NB4 of the control signal B4, and being configured to output the second output signal DoutSelO based on the control signal B4 and the inverted signal NB4 of the control signal B4.

In some embodiments, referring to FIG. 7, the control circuit 101 may further include a first inverter 103 and a second inverter 113. An input terminal of the first inverter 103 receives the control signal B4, an output terminal of the first inverter 103 outputs the inverted signal NB4 of the control signal B4, and one input terminal of each of the first control circuit 131 and the second control circuit 141 is electrically connected to the output terminal of the first inverter 103, to receive the inverted signal NB4 of the control signal B4. An input terminal of the second inverter 113 is electrically connected to the output terminal of the first inverter 103, that is, the input terminal of the second inverter 113 receives the inverted signal NB4 of the control signal B4, an output terminal of the second inverter 113 outputs the control signal B4, and the other input terminal of each of the first control circuit 131 and the second control circuit 141 is electrically connected to the output terminal of the second inverter 113, to receive the control circuit B4.

It should be noted that FIG. 7 is only an example in which the first control circuit 131 and the second control circuit 141 receive the control signal B4 and the inverted signal NB4 of the control signal B4. In an actual application, a specific manner in which the first control circuit 131 and the second control circuit 141 receive the control signal B4 and the inverted signal NB4 of the control signal B4 is not limited.

The first control circuit 131 and the second control circuit 141 are separately described in detail below from a perspective of a logical operation.

In some embodiments, referring to FIG. 8, the first control circuit 131 includes: a first AND gate unit 132, one input terminal receiving the first selection signal Rd_ini, the other input terminal receiving the control signal B4, and an output terminal outputting a first signal R1; a second AND gate unit 133, one input terminal receiving the second selection signal Rd_bst, the other input terminal receiving the inverted signal NB4 of the control signal B4, and an output terminal outputting a second signal R2; and a first NOR gate unit 134, one input terminal receiving the first signal R1, the other input terminal receiving the second signal R2, and an output terminal outputting the first output signal DoutSelE.

A specific working principle of the first control circuit 131 provided in an embodiment of the present disclosure is described in detail below with reference to FIG. 8 and Table 1. It should be noted that in Table 1, 1 indicates a high level, and 0 indicates a low level.

TABLE 1

| Rd_ini | B4 | R1 | Rd_bst | NB4 | R2 | DoutSelE |
|---|---|---|---|---|---|---|
| 1 | 0 | 0 | 0 | 1 | 0 | 1 |
| 0 | 0 | 0 | 1 | 1 | 1 | 0 |
| 1 | 1 | 1 | 0 | 0 | 0 | 0 |
| 0 | 1 | 0 | 1 | 0 | 0 | 1 |

With reference to FIG. 8 and Table 1, when the control signal B4 is in the first state, that is, when the control signal B4 is at a low level and the inverted signal NB4 of the control signal B4 is at a high level, if the first selection signal Rd_ini is at a high level, the first output signal DoutSelE is at a high level, or if the first selection signal Rd_ini is at a low level, the first output signal DoutSelE is at a low level, that is, the waveform of the first output signal DoutSelE is the same as the waveform of the first selection signal Rd_ini.

When the control signal B4 is in the second state, that is, when the control signal B4 is at a high level and the inverted signal NB4 of the control signal B4 is at a low level, if the second selection signal Rd_bst is at a low level, the first output signal DoutSelE is at a low level, or if the second selection signal Rd_bst is at a high level, the first output signal DoutSelE is at a high level, that is, the waveform of the first output signal DoutSelE is the same as the waveform of the second selection signal Rd_bst.

In some embodiments, referring to FIG. 9, the second control circuit 141 may include: a third AND gate unit 142, one input terminal receiving the first selection signal Rd_ini, the other input terminal receiving the inverted signal NB4 of the control signal B4, and an output terminal outputting a third signal R3; a fourth AND gate unit 143, one input terminal receiving the second selection signal Rd_bst, the other input terminal receiving the control signal B4, and an output terminal outputting a fourth signal R4; and a second NOR gate unit 144, one input terminal receiving the third signal R3, the other input terminal receiving the fourth signal R4, and an output terminal outputting the second output signal DoutSelO.

A specific working principle of the second control circuit 141 provided in an embodiment of the present disclosure is described in detail below with reference to FIG. 9 and Table 2. It should be noted that in Table 2, 1 indicates a high level, and 0 indicates a low level.

TABLE 2

| Rd_ini | NB4 | R3 | Rd_bst | B4 | R4 | DoutSelO |
|---|---|---|---|---|---|---|
| 1 | 1 | 1 | 0 | 0 | 0 | 0 |
| 0 | 1 | 0 | 1 | 0 | 0 | 1 |
| 1 | 0 | 0 | 0 | 1 | 0 | 1 |
| 0 | 0 | 0 | 1 | 1 | 1 | 0 |

With reference to FIG. 9 and Table 2, when the control signal B4 is in the first state, that is, when the control signal B4 is at a low level and the inverted signal NB4 of the control signal B4 is at a high level, if the second selection signal Rd_bst is at a low level, the second output signal DoutSelO is at a low level, or if the second selection signal Rd_bst is at a high level, the second output signal DoutSelO is at a high level, that is, the waveform of the second output signal DoutSelO is the same as the waveform of the second selection signal Rd_bst.

When the control signal B4 is in the second state, that is, when the control signal B4 is at a high level and the inverted signal NB4 of the control signal B4 is at a low level, if the first selection signal Rd_ini is at a high level, the second output signal DoutSelO is at a high level, or if the first selection signal Rd_ini is at a low level, the second output signal DoutSelO is at a low level, that is, the waveform of the second output signal DoutSelO is the same as the waveform of the first selection signal Rd_ini.

With reference to Table 1 and Table 2, it may be learned that when the control signal B4 is in the first state, that is, when the control signal B4 is at a low level and the inverted signal NB4 of the control signal B4 is at a high level, if the first selection signal Rd_ini is at a high level and the second selection signal Rd_bst is at a low level, the first output signal DoutSelE is at a high level like the first selection signal Rd_ini, and the second output signal DoutSelO is at a low level like the second selection signal Rd_bst, or if the first selection signal Rd_ini is at a low level and the second selection signal Rd_bst is at a high level, the first output signal DoutSelE is at a low level like the first selection signal Rd_ini, and the second output signal DoutSelO is at a high level like the second selection signal Rd_bst.

When the control signal B4 is in the second state, that is, when the control signal B4 is at a high level and the inverted signal NB4 of the control signal B4 is at a low level, if the first selection signal Rd_ini is at a high level and the second selection signal Rd_bst is at a low level, the first output signal DoutSelE is at a low level like the second selection signal Rd_bst, and the second output signal DoutSelO is at a high level like the first selection signal Rd_ini, or if the first selection signal Rd_ini is at a low level and the second selection signal Rd_bst is at a high level, the first output signal DoutSelE is at a high level like the second selection signal Rd_bst, and the second output signal DoutSelO is at a low level like the first selection signal Rd_ini.

The first control circuit 131 and the second control circuit 141 are separately described in detail below from a perspective of disposing a transistor.

In some embodiments, referring to FIG. 10, the first control circuit 131 may include: a first pull-up unit 151, connected between a power supply node Vcc and a first node net1, and configured to pull up a voltage at the first node net1 based on the first selection signal Rd_ini, the second selection signal Rd_bst, the control signal B4, and the inverted signal NB4 of the control signal B4; and a first pull-down unit 161, connected between a ground terminal and the first node net1, and configured to pull down the voltage at the first node net1 based on the first selection signal Rd_ini, the second selection signal Rd_bst, the control signal B4, and the inverted signal NB4 of the control signal B4. The first node net1 outputs the first output signal DoutSelE.

It may be understood that when the first pull-up unit 151 conducts a circuit between the power supply node Vcc and the first node net1 based on the first selection signal Rd_ini, the second selection signal Rd_bst, the control signal B4, and the inverted signal NB4 of the control signal B4, a voltage at the power supply node Vcc is shared with the first node net1, to pull up the voltage at the first node net1, so that the first output signal DoutSelE output by the first node net1 is at a high level. When the first pull-down unit 161 conducts a circuit between the first node net1 and the ground terminal based on the first selection signal Rd_ini, the second selection signal Rd_bst, the control signal B4, and the inverted signal NB4 of the control signal B4, the voltage at the first node net1 is discharged to the ground terminal, to pull down the voltage at the first node net1, so that the first output signal DoutSelE output by the first node net1 is at a low level.

In some embodiments, referring to FIG. 11, the first pull-up unit 151 may include: at least two PMOS transistors connected in parallel between the first node net1 and a second node net2, gates of the at least two PMOS transistors respectively receiving the first selection signal Rd_ini or the control signal B4; and at least two PMOS transistors connected in parallel between the power supply node Vcc and the second node net2, gates of the at least two PMOS transistors respectively receiving the second selection signal Rd_bst or the inverted signal NB4 of the control signal B4; and the first pull-down unit 161 may include: at least two NMOS transistors connected in series between the first node net1 and the ground terminal, gates of the at least two NMOS transistors respectively receiving the second selection signal Rd_bst or the inverted signal NB4 of the control signal B4; and at least two NMOS transistors connected in series between the first node net1 and the ground terminal, gates of the at least two NMOS transistors respectively receiving the first selection signal Rd_ini or the control signal B4.

It may be understood that the at least two PMOS transistors connected in parallel between the power supply node Vcc and the second node net2 may conduct at least one path between the power supply node Vcc and the second node net2 based on the second selection signal Rd_bst or the inverted signal NB4 of the control signal B4, and the at least two PMOS transistors connected in parallel between the first node net1 and the second node net2 may conduct at least one path between the first node net1 and the second node net2 based on the first selection signal Rd_ini or the control signal B4. In this way, changes of the first selection signal Rd_ini, the second selection signal Rd_bst, the control signal B4, and the inverted signal NB4 of the control signal B4 can be flexibly set, to flexibly select a to-be-conducted path between the power supply node Vcc and the second node net2 and a to-be-conducted path between the second node net2 and the first node net1.

In addition, there are at least two paths that can be conducted between the first node net1 and the ground terminal. One path is provided by the at least two NMOS transistors that are connected in series and that receive the second selection signal Rd_bst or the inverted signal NB4 of the control signal B4, and the other path is provided by the at least two NMOS transistors that are connected in series and that receive the first selection signal Rd_ini or the control signal B4.

In some embodiments, still referring to FIG. 11, the first pull-up unit 151 may include: a first PMOS transistor MP1, connected between the first node net1 and the second node net2, a gate of the first PMOS transistor MP1 receiving the first selection signal Rd_ini; a second PMOS transistor MP2, connected between the first node net1 and the second node net2, a gate of the second PMOS transistor MP2 receiving the control signal B4; a third PMOS transistor MP3, connected between the power supply node Vcc and the second node net2, a gate of the third PMOS transistor MP3 receiving the second selection signal Rd_bst; and a fourth PMOS transistor MP4, connected between the power supply node Vcc and the second node net2, a gate of the fourth PMOS transistor MP4 receiving the inverted signal NB4 of the control signal B4.

In some embodiments, still referring to FIG. 11, the first pull-down unit 161 may include: a first NMOS transistor MN1 and a second NMOS transistor MN2, a drain of the first NMOS transistor MN1 being connected to the first node net1, a source of the first NMOS transistor MN1 being connected to a drain of the second NMOS transistor MN2, a source of the second NMOS transistor MN2 being connected to the ground terminal, a gate of the first NMOS transistor MN1 receiving the second selection signal Rd_bst, and a gate of the second NMOS transistor MN2 receiving the inverted signal NB4 of the control signal B4; and a third NMOS transistor MN3 and a fourth NMOS transistor MN4, a drain of the third NMOS transistor MN3 being connected to the first node net1, a source of the third NMOS transistor MN3 being connected to a drain of the fourth NMOS transistor MN4, a source of the fourth NMOS transistor MN4 being connected to the ground terminal, a gate of the third NMOS transistor MN3 receiving the first selection signal Rd_ini, and a gate of the fourth NMOS transistor MN4 receiving the control signal B4.

It should be noted that in FIG. 11, an example in which two PMOS transistors are connected in parallel between the power supply node Vcc and the second node net2, and two PMOS transistors are connected in parallel between the first node net1 and the second node net2 is utilized. In an actual application, three, four, five, or six PMOS transistors may be connected in parallel between the power supply node Vcc and the second node net2, and three, four, five, or six PMOS transistors may be connected in parallel between the first node net1 and the second node net2. In addition, in FIG. 11, an example in which two NMOS transistors connected in series between the ground terminal and the first node net1 is utilized. In an actual application, three, four, five, or six NMOS transistors may be connected in series between the ground terminal and the first node net1.

With reference to FIG. 11, Table 1, and Table 2, when the control signal B4 is in the first state, that is, when the control signal B4 is at a low level and the inverted signal NB4 of the control signal B4 is at a high level, if the first selection signal Rd_ini is at a high level and the second selection signal Rd_bst is at a low level, the gates of the second PMOS transistor MP2 and the third PMOS transistor MP3 receive a low level and are turned on, to conduct a path between the power supply node Vcc and the first node net1, so as to pull up the voltage at the first node net1, so that the output first output signal DoutSelE is at a high level like the first selection signal Rd_ini. In this case, the gates of the second NMOS transistor MN2 and the third NMOS transistor MN3 receive a high level and are turned on, the gates of the first NMOS transistor MN1 and the fourth MOS transistor MN4 receive a low level and are turned off, and no path is conducted between the first node net1 and the ground terminal.

When the control signal B4 is in the first state, that is, when the control signal B4 is at a low level and the inverted signal NB4 of the control signal B4 is at a high level, if the first selection signal Rd_ini is at a low level and the second selection signal Rd_bst is at a high level, the gates of the first NMOS transistor MN1 and the second NMOS transistor MN2 receive a high level and are turned on, to conduct a path between the ground terminal and the first node net1, so as to pull down the voltage at the first node net1, so that the output first output signal DoutSelE is at a low level like the first selection signal Rd_ini. In this case, the gates of the first PMOS transistor MP1 and the second PMOS transistor MP2 receive a low level and are turned on, the gates of the third PMOS transistor MP3 and the fourth PMOS transistor MP4 receive a high level and are turned off, and no path is conducted between the power supply node Vcc and the second node net2, so that no path is conducted between the power supply node Vcc and the first node net1.

When the control signal B4 is in the second state, that is, when the control signal B4 is at a high level and the inverted signal NB4 of the control signal B4 is at a low level, if the first selection signal Rd_ini is at a high level and the second selection signal Rd_bst is at a low level, the gates of the third NMOS transistor MN3 and the fourth NMOS transistor MN4 receive a high level and are turned on, to conduct a path between the ground terminal and the first node net1, so as to pull down the voltage at the first node net1, so that the output first output signal DoutSelE is at a low level like the second selection signal Rd_bst. In this case, the gates of the first PMOS transistor MP1 and the second PMOS transistor MP2 receive a high level and are turned off, the gates of the third PMOS transistor MP3 and the fourth PMOS transistor MP4 receive a low level and are turned on, and no path is conducted between the first node net1 and the second node net2, so that no path is conducted between the power supply node Vcc and the first node net1.

When the control signal B4 is in the second state, that is, when the control signal B4 is at a high level and the inverted signal NB4 of the control signal B4 is at a low level, if the first selection signal Rd_ini is at a low level and the second selection signal Rd_bst is at a high level, the gates of the first PMOS transistor MP1 and the fourth PMOS transistor MP4 receive a low level and are turned on, to conduct a path between the power supply node Vcc and the first node net1, so as to pull up the voltage at the first node net1, so that the output first output signal DoutSelE is at a high level like the second selection signal Rd_bst. In this case, the gates of the first NMOS transistor MN1 and the fourth NMOS transistor MN4 receive a high level and are turned on, the gates of the second NMOS transistor MN2 and the third NMOS transistor MN3 receive a low level and are turned off, and no path is conducted between the first node net1 and the ground terminal.

In some embodiments, referring to FIG. 10, the second control circuit 141 may include: a second pull-up unit 171, connected between a power supply node Vcc and a third node net3, and configured to pull up a voltage at the third node net3 based on the first selection signal Rd_ini, the second selection signal Rd_bst, the control signal B4, and the inverted signal NB4 of the control signal B4; and a second pull-down unit 181, connected between a ground terminal and the third node net3, and configured to pull down the voltage at the third node net3 based on the first selection signal Rd_ini, the second selection signal Rd_bst, the control signal B4, and the inverted signal NB4 of the control signal B4. The third node net3 outputs the second output signal DoutSelO.

It may be understood that when the second pull-up unit 171 conducts a circuit between the power supply node Vcc and the third node net3 based on the first selection signal Rd_ini, the second selection signal Rd_bst, the control signal B4, and the inverted signal NB4 of the control signal B4, a voltage at the power supply node Vcc is shared with the third node net3, to pull up the voltage at the third node net3, so that the second output signal DoutSelO output by the third node net3 is at a high level. When the second pull-down unit 181 conducts a circuit between the third node net3 and the ground terminal based on the first selection signal Rd_ini, the second selection signal Rd_bst, the control signal B4, and the inverted signal NB4 of the control signal B4, the voltage at the third node net3 is discharged to the ground terminal, to pull down the voltage at the third node net3, so that the second output signal DoutSelO output by the third node net3 is at a low level.

In some embodiments, referring to FIG. 12, the second pull-up unit 171 may include: at least two PMOS transistors connected in parallel between the third node net3 and a fourth node net4, gates of the at least two PMOS transistors respectively receiving the first selection signal Rd_ini or the inverted signal NB4 of the control signal B4; and at least two PMOS transistors connected in parallel between the power supply node Vcc and the fourth node net4, gates of the at least two PMOS transistors respectively receiving the second selection signal Rd_bst or the control signal B4; and the second pull-down unit 181 may include: at least two NMOS transistors connected in series between the third node net3 and the ground terminal, gates of the at least two NMOS transistors respectively receiving the second selection signal Rd_bst or the control signal B4; and at least two NMOS transistors connected in series between the third node net3 and the ground terminal, gates of the at least two NMOS transistors respectively receiving the first selection signal Rd_ini or the inverted signal NB4 of the control signal B4.

It may be understood that the at least two PMOS transistors connected in parallel between the power supply node Vcc and the fourth node net4 may conduct at least one path between the power supply node Vcc and the fourth node net4 based on the second selection signal Rd_bst or the control signal B4, and the at least two PMOS transistors connected in parallel between the third node net3 and the fourth node net4 may conduct at least one path between the third node net3 and the fourth node net4 based on the first selection signal Rd_ini or the inverted signal NB4 of the control signal B4. In this way, changes of the first selection signal Rd_ini, the second selection signal Rd_bst, the control signal B4, and the inverted signal NB4 of the control signal B4 can be flexibly set, to flexibly select a to-be-conducted path between the power supply node Vcc and the fourth node net4 and a to-be-conducted path between the fourth node net4 and the third node net3.

In addition, there are at least two paths that can be conducted between the third node net3 and the ground terminal. One path is provided by the at least two NMOS transistors that are connected in series and that receive the second selection signal Rd_bst or the control signal B4, and the other path is provided by the at least two NMOS transistors that are connected in series and that receive the first selection signal Rd_ini or the inverted signal NB4 of the control signal B4.

In some embodiments, still referring to FIG. 12, the second pull-up unit 171 may include: a fifth PMOS transistor MP5, connected between the third node net3 and the fourth node net4, a gate of the fifth PMOS transistor MP5 receiving the first selection signal Rd_ini; a sixth PMOS transistor MP6, connected between the third node net3 and the fourth node net4, a gate of the sixth PMOS transistor MP6 receiving the inverted signal of the control signal B4; a seventh PMOS transistor MP7, connected between the power supply node Vcc and the fourth node net4, a gate of the seventh PMOS transistor MP7 receiving the second selection signal Rd_bst; and an eighth PMOS transistor MP8, connected between the power supply node Vcc and the fourth node net4, a gate of the eighth PMOS transistor MP8 receiving the control signal B4.

In some embodiments, still referring to FIG. 12, the second pull-down unit 181 may include: a fifth NMOS transistor MN5 and a sixth NMOS transistor MN6, a drain of the fifth NMOS transistor MN5 being connected to the third node net3, a source of the fifth NMOS transistor MN5 being connected to a drain of the sixth NMOS transistor MN6, a source of the sixth NMOS transistor MN6 being connected to the ground terminal, a gate of the fifth NMOS transistor MN5 receiving the second selection signal Rd_bst, and a gate of the sixth NMOS transistor MN6 receiving the control signal B4; and a seventh NMOS transistor MN7 and an eighth NMOS transistor MN8, a drain of the seventh NMOS transistor MN7 being connected to the third node net3, a source of the seventh NMOS transistor MN7 being connected to a drain of the eighth NMOS transistor MN8, a source of the eighth NMOS transistor MN8 being connected to the ground terminal, a gate of the seventh NMOS transistor MN7 receiving the first selection signal Rd_ini, and a gate of the eighth NMOS transistor MN8 receiving the inverted signal NB4 of the control signal B4.

It should be noted that in FIG. 11, an example in which two PMOS transistors are connected in parallel between the power supply node Vcc and the second node net2, and two PMOS transistors are connected in parallel between the first node net1 and the second node net2 is utilized. In an actual application, three, four, five, or six PMOS transistors may be connected in parallel between the power supply node Vcc and the second node net2, and three, four, five, or six PMOS transistors may be connected in parallel between the first node net1 and the second node net2. In addition, in FIG. 11, an example in which two NMOS transistors connected in series between the ground terminal and the first node net1 is utilized. In an actual application, three, four, five, or six NMOS transistors may be connected in series between the ground terminal and the first node net1.

With reference to FIG. 12, Table 1, and Table 2, when the control signal B4 is in the first state, that is, when the control signal B4 is at a low level and the inverted signal NB4 of the control signal B4 is at a high level, if the first selection signal Rd_ini is at a high level and the second selection signal Rd_bst is at a low level, the gates of the seventh NMOS transistor MN7 and the eighth NMOS transistor MN8 receive a high level and are turned on, to conduct a path between the ground terminal and the third node net3, so as to pull down the voltage at the third node net3, so that the output second output signal DoutSelO is at a low level like the second selection signal Rd_bst. In this case, the gates of the fifth PMOS transistor MP5 and the sixth PMOS transistor MP6 receive a high level and are turned off, the gates of the seventh PMOS transistor MP7 and the eighth PMOS transistor MP8 receive a low level and are turned on, and no path is conducted between the third node net3 and the fourth node net4, so that no path is conducted between the power supply node Vcc and the third node net3.

When the control signal B4 is in the first state, that is, when the control signal B4 is at a low level and the inverted signal NB4 of the control signal B4 is at a high level, if the first selection signal Rd_ini is at a low level and the second selection signal Rd_bst is at a high level, the gates of the fifth PMOS transistor MP5 and the eighth PMOS transistor MP8 receive a low level and are turned on, to conduct a path between the power supply node Vcc and the third node net3, so as to pull up the voltage at the third node net3, so that the output second output signal DoutSelO is at a high level like the second selection signal Rd_bst. In this case, the gates of the fifth NMOS transistor MN5 and the eighth NMOS transistor MN8 receive a high level and are turned on, the gates of the sixth NMOS transistor MN6 and the seventh NMOS transistor MN7 receive a low level and are turned off, and no path is conducted between the third node net3 and the ground terminal.

When the control signal B4 is in the second state, that is, when the control signal B4 is at a high level and the inverted signal NB4 of the control signal B4 is at a low level, if the first selection signal Rd_ini is at a high level and the second selection signal Rd_bst is at a low level, the gates of the sixth PMOS transistor MP6 and the seventh PMOS transistor MP7 receive a low level and are turned on, to conduct a path between the power supply node Vcc and the third node net3, so as to pull up the voltage at the third node net3, so that the output second output signal DoutSelO is at a high level like the first selection signal Rd_ini. In this case, the gates of the sixth NMOS transistor MN6 and the seventh NMOS transistor MN7 receive a high level and are turned on, the gates of the fifth NMOS transistor MN5 and the eighth NMOS transistor MN8 receive a low level and are turned off, and no path is conducted between the third node net3 and the ground terminal.

When the control signal B4 is in the second state, that is, when the control signal B4 is at a high level and the inverted signal NB4 of the control signal B4 is at a low level, if the first selection signal Rd_ini is at a low level and the second selection signal Rd_bst is at a high level, the gates of the fifth NMOS transistor MN5 and the sixth NMOS transistor MN6 receive a high level and are turned on, to conduct a path between the ground terminal and the third node net3, so as to pull down the voltage at the third node net3, so that the output second output signal DoutSelO is at a low level like the first selection signal Rd_ini. In this case, the gates of the fifth PMOS transistor MP5 and the sixth PMOS transistor MP6 receive a low level and are turned on, the gates of the seventh PMOS transistor MP7 and the eighth PMOS transistor MP8 receive a high level and are turned off, and no path is conducted between the power supply node Vcc and the fourth node net4, so that no path is conducted between the power supply node Vcc and the third node net3.

It should be noted that in the foregoing descriptions of the high level and the low level, the high level may be a level value greater than or equal to a power supply voltage, and the low level may be a level value less than or equal to a ground voltage. In addition, the high level and the low level are relative to each other, and specific level value ranges included in the high level and the low level may be determined based on a specific component. For example, for an NMOS transistor, the high level refers to a level value range of a gate voltage that enables the NMOS transistor to be turned on, and the low level refers to a level value range of a gate voltage that enables the NMOS transistor to be turned off. For a PMOS transistor, the low level refers to a level value range of a gate voltage that enables the PMOS transistor to be turned on, and the high level refers to a level value range of a gate voltage that enables the PMOS transistor to be turned off.

In conclusion, both a path configured to transmit the first data Data1 and a path configured to transmit the second data Data2 are fixed. This helps reduce complexity of transmission paths configured to transmit the first data Data1 and the second data Data2. In addition, the control signal B4 for controlling a transmission sequence of the first data Data1 and the second data Data2 does not need to be transmitted to the memory array ARRAY through a transmission path, and only needs to be transmitted to the control circuit 101. This helps shorten a transmission path of the control signal B4 in the data read circuit, to reduce power consumption required for transmitting the control signal B4. Furthermore, the control circuit 101 outputs the first output signal DoutSelE and the second output signal DoutSelO based on the control signal B4, the first selection signal Rd_ini, and the second selection signal Rd_bst, and the output circuit 102 adjusts the transmission sequence of the first data Data1 and the second data Data2 based on the waveform of the first output signal DoutSelE and a waveform change of the second output signal DoutSelO. This helps reduce the power consumption required for transmitting the control signal B4, and ensure that the transmission sequence of the first data Data1 and the second data Data2 changes based on a change of the control signal B4.

Another embodiment of the present disclosure further provides a storage device, including the data read circuit provided in an embodiment of the present disclosure. While ensuring that data in the storage device can have different output sequences based on different states of the control signal B4, this helps reduce power consumption of the storage device.

In some embodiments, the storage device may be a DDR memory, e.g., a DDR4 memory, a DDR5 memory, a DDR6 memory, an LPDDR4 memory, an LPDDR5 memory, or an LPDDR6 memory.

A person of ordinary skill in the art may understand that the foregoing implementations are specific embodiments for implementing the present disclosure. In an actual application, various modifications may be made to the forms and details of the implementations without departing from the spirit and scope of the embodiments of the present disclosure. Any person skilled in the art may make changes and modifications without departing from the spirit and scope of the embodiments of the present disclosure. Therefore, the protection scope of the embodiments of the present disclosure shall be subject to the scope defined by the claims.

What is claimed is:

1. A data read circuit, comprising:

a first data transmission path, configured to transmit first data;

a second data transmission path, configured to transmit second data;

a control circuit, the control circuit having a first output terminal and a second output terminal, the control circuit being configured to: receive a control signal, a first selection signal, and a second selection signal, and output a first output signal and a second output signal, and in a same cycle, a waveform of the first output signal being the same as a waveform of one of the first selection signal and the second selection signal, and a waveform of the second output signal being the same as a waveform of the other one of the first selection signal and the second selection signal; and an output circuit, configured to output the first data and the second data based on the first output signal and the second output signal, the first data being transmitted to a third data transmission path before the second data if the waveform of the first output signal is the same as a waveform of the first selection signal, and the waveform of the second output signal is the same as a waveform of the second selection signal; or the second data being transmitted to the third data transmission path before the first data if the waveform of the first output signal is the same as a waveform of the second selection signal, and the waveform of the second output signal is the same as a waveform of the first selection signal.

2. The data read circuit according to claim 1, wherein the output circuit comprises:

a first output circuit, connected to the first output terminal, receiving the first data, and configured to transmit the first data to the third data transmission path based on the first output signal; and a second output circuit, connected to the second output terminal, receiving the second data, and configured to transmit the second data to the third data transmission path based on the second output signal.

3. The data read circuit according to claim 1, wherein the control circuit is configured to: output the first selection signal as the first output signal and output the second selection signal as the second output signal based on the control signal when the control signal is in a first state, or output the second selection signal as the first output signal and output the first selection signal as the second output signal based on the control signal when the control signal is in a second state.

4. The data read circuit according to claim 3, wherein the control circuit comprises:

a first data selector, a first input terminal of the first data selector receiving the first selection signal, a second input terminal of the first data selector receiving the second selection signal, a data selection terminal of the first data selector receiving the control signal, and an output terminal of the first data selector serving as the first output terminal; and a second data selector, a first input terminal of the second data selector receiving the first selection signal, a second input terminal of the second data selector receiving the second selection signal, a data selection terminal of the second data selector receiving an inverted signal of the control signal, and an output terminal of the second data selector serving as the second output terminal.

5. The data read circuit according to claim 1, wherein the waveform of the first output signal is the same as the waveform of the first selection signal, and the waveform of the second output signal is the same as the waveform of the second selection signal when the control signal is in the first state, or the waveform of the first output signal is the same as the waveform of the second selection signal, and the waveform of the second output signal is the same as the waveform of the first selection signal when the control signal is in the second state.

6. The data read circuit according to claim 5, wherein the control circuit comprises:

a first control circuit having the first output terminal, the first control circuit receiving the first selection signal, the second selection signal, the control signal, and the inverted signal of the control signal, and being configured to output the first output signal based on the control signal and the inverted signal of the control signal; and a second control circuit having the second output terminal, the second control circuit receiving the first selection signal, the second selection signal, the control signal, and the inverted signal of the control signal, and being configured to output the second output signal based on the control signal and the inverted signal of the control signal.

7. The data read circuit according to claim 6, wherein the control circuit further comprises a first inverter and a second inverter, an input terminal of the first inverter receives the control signal, an output terminal of the first inverter outputs the inverted signal of the control signal, one input terminal of each of the first control circuit and the second control circuit is electrically connected to the output terminal of the first inverter, to receive the inverted signal of the control signal, an input terminal of the second inverter is electrically connected to the output terminal of the first inverter, an output terminal of the second inverter outputs the control signal, and the other input terminal of each of the first control circuit and the second control circuit is electrically connected to the output terminal of the second inverter, to receive the control signal.

8. The data read circuit according to claim 6, wherein the first control circuit comprises:

a first AND gate unit, one input terminal receiving the first selection signal, the other input terminal receiving the control signal, and an output terminal outputting a first signal;

a second AND gate unit, one input terminal receiving the second selection signal, the other input terminal receiving the inverted signal of the control signal, and an output terminal outputting a second signal; and a first NOR gate unit, one input terminal receiving the first signal, the other input terminal receiving the second signal, and an output terminal outputting the first output signal.

9. The data read circuit according to claim 6, wherein the second control circuit comprises:

a third AND gate unit, one input terminal receiving the first selection signal, the other input terminal receiving the inverted signal of the control signal, and an output terminal outputting a third signal;

a fourth AND gate unit, one input terminal receiving the second selection signal, the other input terminal receiving the control signal, and an output terminal outputting a fourth signal; and a second NOR gate unit, one input terminal receiving the third signal, the other input terminal receiving the fourth signal, and an output terminal outputting the second output signal.

10. The data read circuit according to claim 6, wherein the first control circuit comprises:

a first pull-up unit, connected between a power supply node and a first node, and configured to pull up a voltage at the first node based on the first selection signal, the second selection signal, the control signal, and the inverted signal of the control signal; and a first pull-down unit, connected between a ground terminal and the first node, and configured to pull down the voltage at the first node based on the first selection signal, the second selection signal, the control signal, and the inverted signal of the control signal, wherein the first node outputs the first output signal.

11. The data read circuit according to claim 10, wherein the first pull-up unit comprises:

at least two PMOS transistors connected in parallel between the first node and a second node, gates of the at least two PMOS transistors respectively receiving the first selection signal or the control signal; and at least two PMOS transistors connected in parallel between the power supply node and the second node, gates of the at least two PMOS transistors respectively receiving the second selection signal or the inverted signal of the control signal.

12. The data read circuit according to claim 11, wherein the first pull-up unit comprises:

a first PMOS transistor, connected between the first node and the second node, a gate of the first PMOS transistor receiving the first selection signal;

a second PMOS transistor, connected between the first node and the second node, a gate of the second PMOS transistor receiving the control signal;

a third PMOS transistor, connected between the power supply node and the second node, a gate of the third PMOS transistor receiving the second selection signal; and a fourth PMOS transistor, connected between the power supply node and the second node, a gate of the fourth PMOS transistor receiving the inverted signal of the control signal.

13. The data read circuit according to claim 10, wherein the first pull-down unit comprises:

at least two NMOS transistors connected in series between the first node and the ground terminal, gates of the at least two NMOS transistors respectively receiving the second selection signal or the inverted signal of the control signal; and at least two NMOS transistors connected in series between the first node and the ground terminal, gates of the at least two NMOS transistors respectively receiving the first selection signal or the control signal.

14. The data read circuit according to claim 13, wherein the first pull-down unit comprises:

a first NMOS transistor and a second NMOS transistor, a drain of the first NMOS transistor being connected to the first node, a source of the first NMOS transistor being connected to a drain of the second NMOS transistor, a source of the second NMOS transistor being connected to the ground terminal, a gate of the first NMOS transistor receiving the second selection signal, and a gate of the second NMOS transistor receiving the inverted signal of the control signal; and a third NMOS transistor and a fourth transistor, a drain of the third NMOS transistor being connected to the first node, a source of the third NMOS transistor being connected to a drain of the fourth NMOS transistor, a source of the fourth NMOS transistor being connected to the ground terminal, a gate of the third NMOS transistor receiving the first selection signal, and a gate of the fourth NMOS transistor receiving the control signal.

15. The data read circuit according to claim 6, wherein the second control circuit comprises:

a second pull-up unit, connected between a power supply node and a third node, and configured to pull up a voltage at the third node based on the first selection signal, the second selection signal, the control signal, and the inverted signal of the control signal; and a second pull-down unit, connected between a ground terminal and the third node, and configured to pull down the voltage at the third node based on the first selection signal, the second selection signal, the control signal, and the inverted signal of the control signal, wherein the third node outputs the second output signal.

16. The data read circuit according to claim 15, wherein the second pull-up unit comprises:

at least two PMOS transistors connected in parallel between the third node and a fourth node, gates of the at least two PMOS transistors respectively receiving the first selection signal or the inverted signal of the control signal; and at least two PMOS transistors connected in parallel between the power supply node and the fourth node, gates of the at least two PMOS transistors respectively receiving the second selection signal or the control signal.

17. The data read circuit according to claim 16, wherein the second pull-up unit comprises:

a fifth PMOS transistor, connected between the third node and the fourth node, a gate of the fifth PMOS transistor receiving the first selection signal;

a sixth PMOS transistor, connected between the third node and the fourth node, a gate of the sixth PMOS transistor receiving the inverted signal of the control signal;

a seventh PMOS transistor, connected between the power supply node and the fourth node, a gate of the seventh PMOS transistor receiving the second selection signal; and an eighth PMOS transistor, connected between the power supply node and the fourth node, a gate of the eighth PMOS transistor receiving the control signal.

18. The data read circuit according to claim 15, wherein the second pull-down unit comprises:

at least two NMOS transistors connected in series between the third node and the ground terminal, gates of the at least two NMOS transistors respectively receiving the second selection signal or the control signal; and at least two NMOS transistors connected in series between the third node and the ground terminal, gates of the at least two NMOS transistors respectively receiving the first selection signal or the inverted signal of the control signal.

19. The data read circuit according to claim 18, wherein the second pull-down unit comprises:

a fifth NMOS transistor and a sixth NMOS transistor, a drain of the fifth NMOS transistor being connected to the third node, a source of the fifth NMOS transistor being connected to a drain of the sixth NMOS transistor, a source of the sixth NMOS transistor being connected to the ground terminal, a gate of the fifth NMOS transistor receiving the second selection signal, and a gate of the sixth NMOS transistor receiving the control signal; and a seventh NMOS transistor and an eighth NMOS transistor, a drain of the seventh NMOS transistor being connected to the third node, a source of the seventh NMOS transistor being connected to a drain of the eighth NMOS transistor, a source of the eighth NMOS transistor being connected to the ground terminal, a gate of the seventh NMOS transistor receiving the first selection signal, and a gate of the eighth NMOS transistor receiving the inverted signal of the control signal.

20. A storage device, comprising the data read circuit according to claim 1.

* * * * *